(12) United States Patent
Wu et al.

(10) Patent No.: US 8,519,524 B1
(45) Date of Patent: Aug. 27, 2013

(54) CHIP STACKING STRUCTURE AND FABRICATING METHOD OF THE CHIP STACKING STRUCTURE

(75) Inventors: Sheng-Tsai Wu, Taoyuan County (TW); John H. Lau, Taipei (TW); Heng-Chieh Chien, New Taipei (TW); Ra-Min Tain, New Taipei (TW); Ming-Ji Dai, Hsinchu (TW); Yu-Lin Chao, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/586,890

(22) Filed: Aug. 16, 2012

(30) Foreign Application Priority Data

May 25, 2012 (TW) .............................. 101118718 A (51) Int. Cl.
  *H01L 23/02* (2006.01)
(52) U.S. Cl.
  USPC .................... 257/686; 257/E23.011; 257/685; 257/774; 438/108; 438/117; 174/256; 174/267; 361/760
(58) Field of Classification Search
  USPC .................... 257/E23.011, E23.067, E23.171, 257/685, 686, 692–695, 698, 702, 737, 738, 257/774, 777–779; 438/106, 108, 110, 117, 438/125, 612; 174/255, 256, 258, 262, 264, 174/265, 267; 361/760, 773, 774, 776
  See application file for complete search history.

(56) References Cited

U.S. PATENT DOCUMENTS

| | | | | |
|---|---|---|---|---|
| 5,438,224 A * | 8/1995 | Papageorge et al. | .......... | 257/777 |
| 6,274,821 B1 * | 8/2001 | Echigo et al. | .......... | 174/255 |
| 6,946,329 B2 * | 9/2005 | Pierson et al. | .......... | 438/117 |
| 7,081,650 B2 * | 7/2006 | Palanduz et al. | .......... | 257/310 |
| 7,576,995 B2 * | 8/2009 | Thomas et al. | .......... | 361/760 |
| 7,795,721 B2 * | 9/2010 | Kurita | .......... | 257/698 |
| 7,875,811 B2 * | 1/2011 | Caletka et al. | .......... | 174/262 |
| 7,928,550 B2 * | 4/2011 | Wachtler | .......... | 257/686 |
| 8,207,605 B2 * | 6/2012 | Kurita | .......... | 257/698 |
| 8,399,983 B1 * | 3/2013 | New | .......... | 257/698 |
| 2002/0027022 A1 * | 3/2002 | Moriizumi | .......... | 174/267 |
| 2002/0030261 A1 * | 3/2002 | Rolda et al. | .......... | 257/685 |
| 2005/0275084 A1 * | 12/2005 | Kirby et al. | .......... | 257/697 |
| 2006/0027935 A1 * | 2/2006 | Hedler et al. | .......... | 257/778 |

\* cited by examiner

*Primary Examiner* — Chris Chu
(74) *Attorney, Agent, or Firm* — Jianq Chyun IP Office (57) ABSTRACT

A chip stacking structure including a carrier, a first redistribution layer, a second redistribution layer, at least one first chip, at least one second chip, and at least one conductor is provided. The carrier has a first surface and a second surface opposite to each other. The carrier has at least one through hole. The first and second redistribution layers are disposed on the first and second surfaces of the carrier, respectively. The first and second chips are disposed on the first and second surfaces of the carrier and electrically connected with the first and second redistribution layers, respectively. The conductor is disposed on one of the first and second chips. The conductor is disposed in the through hole. The first and second chips are electrically connected by the conductor. A gap is formed between the conductor and an inner wall of the carrier which surrounds the through hole.

31 Claims, 12 Drawing Sheets

CHIP STACKING STRUCTURE AND FABRICATING METHOD OF THE CHIP STACKING STRUCTURE

CROSS-REFERENCE TO RELATED APPLICATION

This application claims the priority benefit of Taiwan application serial no. 101118718, filed on May 25, 2012. The entirety of the above-mentioned patent application is hereby incorporated by reference herein and made a part of this specification.

TECHNICAL FIELD

The disclosure relates to a chip stacking structure and a fabricating process of the chip stacking; more specifically, the disclosure relates to a three-dimensional chip stacking structure and a fabricating process of the three-dimensional chip stacking.

BACKGROUND

In recent years, the electronic industry develops and prospers under the guidance of Moore's Law. However, with the needs such as enhancing the computing speed of electronic products, the techniques run into bottlenecks. Three-dimensional integrated circuit integration (3D IC integration) techniques has become one of answers to the current issue that the performance of the electronic products has to meet the needs.

Compared with conventional package techniques, 3D IC integration techniques have many advantages. For example, sizes of devices are smaller, signal loss is reduced, and electrical properties perform better, all of which are due to the utilization of a through silicon via (TSV).

The TSV has become one of the important cores in 3D IC integration techniques, and the fabrication costs of the TSV have to be considered carefully. In a three-dimensional integrated circuit system in package (3D IC SiP) structure having a typical TSV interposer, the TSV interposer carries chips above and below by utilizing microbump structures, and connects to a substrate or a printed circuit board (PCB) via a solder bump structure.

Usually, five steps are required to fabricate a TSV structure:

First step, laser drilling process or deep reactive ion etch (DRIE) process are utilized to form a via.

Second step, a plasma enhanced chemical vapor deposition (PECVD) method is utilized to deposit a dielectric deposition.

Third step, a physical vapor deposition (PVD) method is utilized to deposit a barrier/electroplating seed layer.

Fourth step, copper electroplating is utilized to fill the via (via Cu-filling).

Fifth step, a chemical and mechanical polishing (CMP) process is utilized to remove protruding or extra material.

Fabrication costs for the aforementioned five steps are listed from high to low as: PVD>PECVD>CMP>Electroplating>Etching.

More specifically, the 3D IC integration technique is one of the most effective structures for enhancing performance of electrical products, allows a plurality of chips to interconnect with one another and integrates more computing capability, memory, and other functions in a very small apparatus. However, the conventional 3D IC integration utilizing a TSV requires the use of processes such as PVD and PECVD. As a result, a technical limitation exists as an aspect ratio is hardly improved (a via cannot be completely filled with copper). Moreover, fabrication costs of a TSV is very high due to issues like costly vacuuming, dry process equipment and consumption materials.

Accordingly, it is urgent and requires solutions for solving an issue of high costs in making through silicon via (TSV) in terms of solving a technical problem of 3D IC integration.

SUMMARY

In one embodiment, the chip stacking structure includes a carrier, a first redistribution layer, a second redistribution layer, at least one first chip, at least one second chip, and at least one conductor. The carrier has a first surface and a second surface opposite to each other, and the carrier has at least one through hole. The first redistribution layer is disposed on the first surface of the carrier. The second redistribution layer is disposed on the second surface of the carrier. The first chip is disposed on the first surface of the carrier and electrically connected with the first redistribution layer. The second chip is disposed on the second surface of the carrier and electrically connected with the second redistribution layer. The conductor is disposed on one of the first chip and the second chip, and the conductor is disposed in the through hole, and the first chip and the second chip are electrically connected by the conductor, wherein a gap is formed between the conductor and an inner wall of the carrier which surrounds the through hole.

In another embodiment, the fabricating method of the chip stacking structure is providing a carrier having a first surface and a second surface opposite to each other, wherein the carrier has at least one through hole, and a first redistribution layer is disposed on the first surface of the carrier, and a second redistribution layer is disposed on the second surface of the carrier; providing at least one first chip facing the first surface of the carrier; providing at least one second chip facing the second surface of the carrier, wherein at least one conductor is disposed on one of the first chip and the second chip; and having the conductor pass through a through hole and electrically connect the first chip and the second chip, wherein a gap is formed between the conductor and an inner wall of the carrier which surrounds the through hole.

In order to make the aforementioned features and advantages of the disclosure more comprehensible, embodiments accompanying figures are described in detail below.

BRIEF DESCRIPTION OF THE DRAWINGS

The accompanying drawings are included to provide further understanding and are incorporated in and constitute a part of this specification. The drawings illustrate exemplary embodiments and, together with the description, serve to explain the principles of the invention.

DETAILED DESCRIPTION OF DISCLOSED EMBODIMENTS

Figure 1:
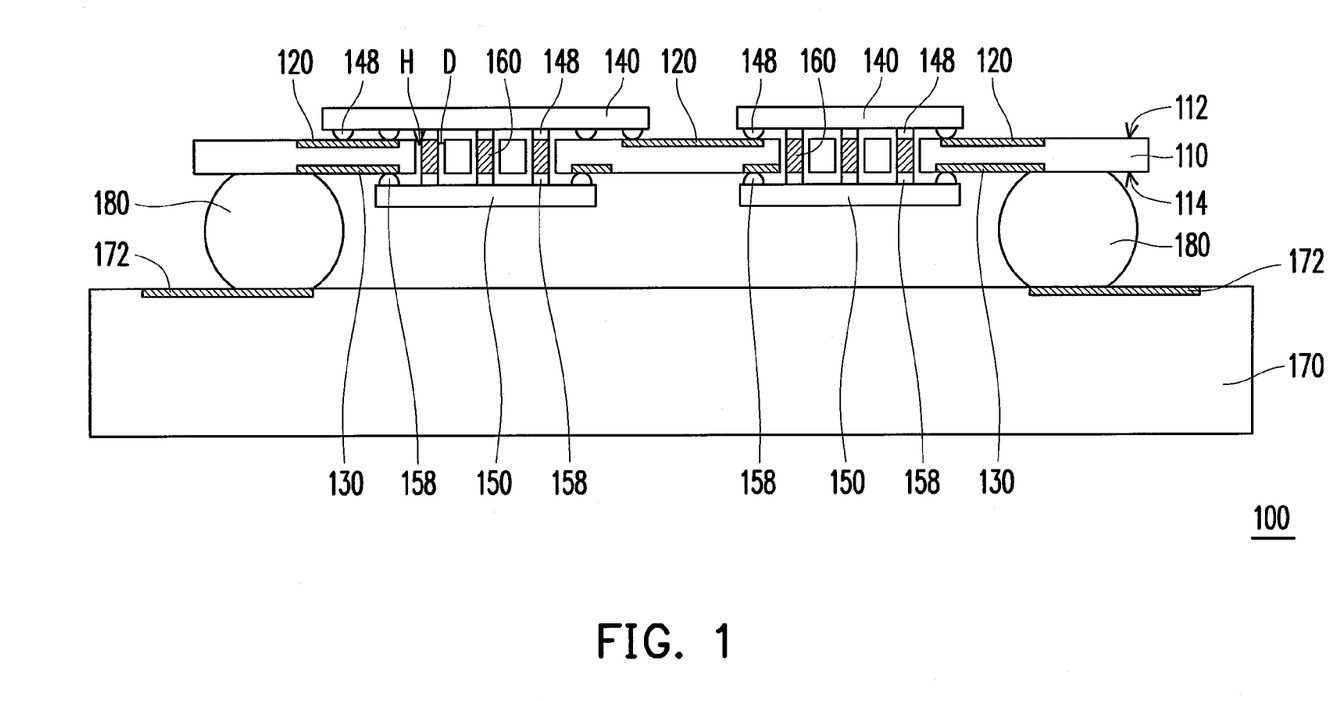
FIG. 1 is a schematic view of a chip stacking structure according to an embodiment of the disclosure.

FIG. 1 is a schematic view of a chip stacking structure according to an embodiment of the disclosure. Referring to FIG. 1, a chip stacking structure 100 includes a carrier 110, a first redistribution layer 120, a second redistribution layer 130, at least one first chip 140, at least one second chip 150, and at least one conductor 160. The carrier 110 has a first surface 112 and a second surface 114 opposite to each other. The carrier 110 has at least one through hole H. The first redistribution layer 120 is disposed on the first surface 112 of the carrier 110. The second redistribution layer 130 is disposed on the second surface 114 of the carrier 110. The first chip 140 is disposed on the first surface 112 of the carrier 110 and electrically connected with the first redistribution layer 120. The second chip 150 is disposed on the second surface 114 of the carrier 110 and electrically connected with the second redistribution layer 130. The conductor 160 is disposed on one of the first chip 140 and the second chip 150. The conductor 160 is disposed in the through hole H, and the first chip 140 and the second chip 150 are electronically connected by the conductor 160, wherein a gap D is formed between the conductor 160 and an inner wall of the carrier 110 which surrounds the through hole H.

That "the conductor 160 is disposed on one of the first chip 140 and the second chip 150" indicates that the conductor 160 may be fabricated together with the first chip 140, or that the conductor 160 may be fabricated together with the second chip 150. The conductor 160 may be a conductive wire, a conductive pillar, or a conductive pad, suitable for passing through the through hole H of the carrier 110. In addition, the conductor 160 may be selected from Au, Cu, Ni, Ag, and combinations thereof. Later, in FIG. 5A to FIG. 5H, a process of fabricating the conductor 160 on the first chip 140 or on the second chip 150 will be described in details.

Referring to FIG. 1, the first chip 140 and the second chip 150 are electrically connected to each other via the conductor 160 which is disposed in the through hole H, and the gap D is formed between the conductor 160 and the inner wall of the carrier 110 which surrounds the through hole H. More specifically, a metallization process is not performed in the through hole H of the chip stacking structure 100.

Furthermore, the gap D may be filled with air or inert gas. When the gap D is filled with inert gas, the conductor 160 is not prone to be oxidized, and an operation of the chip stacking structure 100 remains smooth. In addition, the gap D may be filled with an insulating filler to enhance a structural strength of the chip stacking structure 100.

Figure 2A:
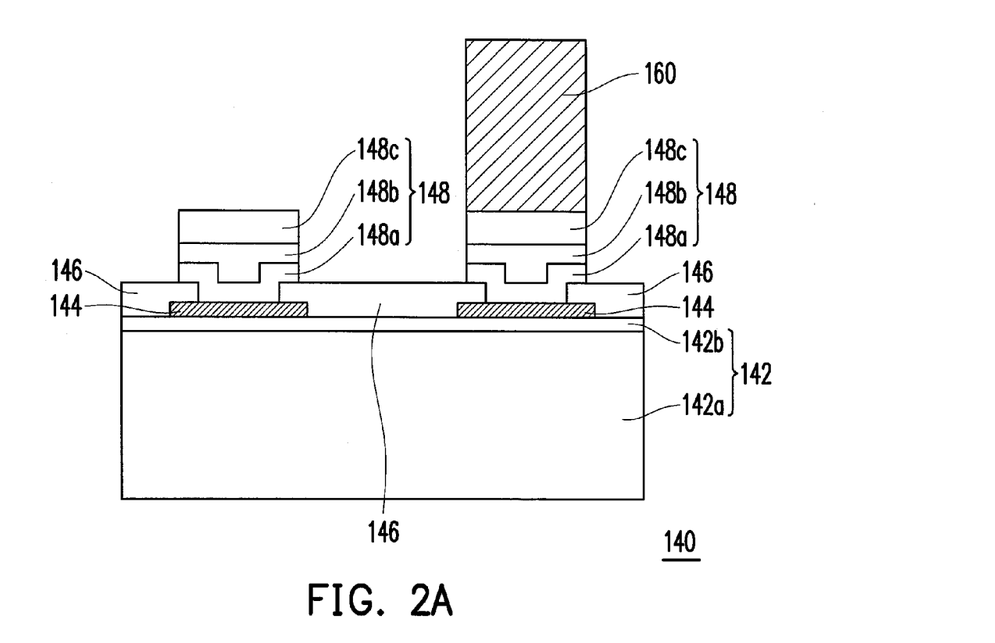
FIG. 2A is a partially enlarged schematic view of a first chip of FIG. 1.

FIG. 2A is a partially enlarged schematic view of the first chip of FIG. 1. Referring to FIG. 1 and FIG. 2A together, the first chip 140 may includes a first substrate 142, a first circuit layer 144, a first patterned insulating layer 146, and a first microbump 148. The first circuit layer 144 is disposed on the first substrate 142. The first patterned insulating layer 146 covers the first circuit layer 144, and the first patterned insulating layer 146 exposes a part of the first circuit layer 144. The first microbump 148 is disposed in contact with the exposed first circuit layer 144. The conductor 160 may be connected with the first microbump 148.

Referring to FIG. 2A again, the first substrate 142 may be a silicon wafer, including a silicon substrate 142a and a silicon oxide layer 142b. And the first microbump 148 may include a plurality of film layers 148a, 148b, and 148c being stacked. For example, the film layer 148a is a TiW film layer, the film layer 148b is a Cu film layer, and the film layer 148c is a Ni film layer.

Figure 2B:
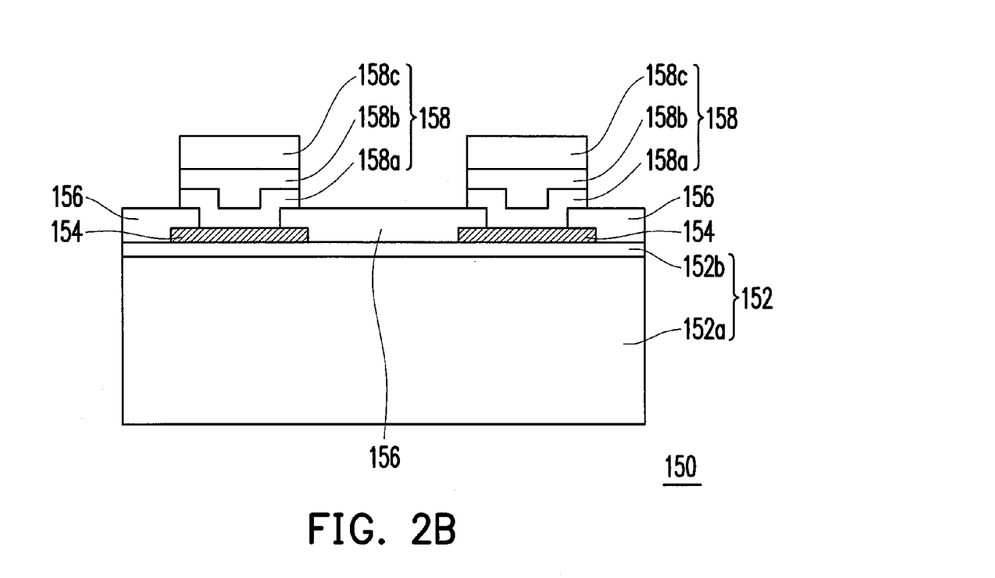
FIG. 2B is a partially enlarged schematic view of a second chip of FIG. 1.

FIG. 2B is a partially enlarged schematic view of the second chip of FIG. 1. Referring to FIG. 1 and FIG. 2B together, the second chip 150 may includes a second substrate 152, a second circuit layer 154, a second patterned insulating layer 156, and a second microbump 158. The second circuit layer 154 is disposed on the second substrate 152. The second patterned insulating layer 156 covers the second circuit layer 154, and the second patterned insulating layer 156 exposes a part of the second circuit layer 154. The second microbump 158 is disposed in contact with the exposed second circuit layer 154.

Referring to FIG. 2B again, the second substrate 152 may be a silicon wafer, including a silicon substrate 152a and a silicon oxide layer 152b. And the second microbump 158 may include a plurality of film layers 158a, 158b, and 158c being stacked. For example, the film layer 158a is a TiW film layer, the film layer 158b is a Cu film layer, and the film layer 158c is a Ni film layer.

In the embodiment illustrated in FIG. 2A and FIG. 2B, the conductor 160 is fabricated on the first chip 140, but not on the second chip 150. However, various embodiments are also applicable; i.e. the conductor 160 is fabricated on the second chip 150, but not on the first chip 140, or the conductor 160 is fabricated on both the first chip 140 and the second chip 150 but in a way of a staggered arrangement. Regardless of ways of fabricating the conductor 160, the ultimate goal is to insert the conductor 160 properly into the through hole H so as to assemble the carrier 110, the first chip 140, and the second chip 150.

Referring to FIG. 1 again, the first microbump 148 may also be connected between the first chip 140 and the first redistribution layer 120, so that a plurality of the first chips 140 may be electrically connected with one another via the first redistribution layer 120 and transmit electrical signals. The first microbump 148 allows the first chip 140 to steadily bond to the first surface 112 of the carrier 110 so as to enhance the structural strength of the chip stacking structure 100.

Similarly, the second microbump 158 may be connected between the second chip 150 and the second redistribution layer 130, so that a plurality of the second chips 150 may be electrically connected with one another via the second redistribution layer 130 and transmit electrical signals. The second microbump 158 allows the second chip 150 to steadily bond to the second surface 114 of the carrier 110 so as to enhance the structural strength of the chip stacking structure 100.

Referring to FIG. 1, the chip stacking structure 100 further includes a carrier board 170 and a solder ball 180. The carrier board 170 has a third redistribution layer 172. The carrier board 170 may be a printed circuit board (PCB) having a circuit pattern thereon. The solder ball 180 is disposed between the second redistribution layer 130 and the third redistribution layer 172.

Accordingly, the chip stacking structure 100 has a simple structure which can replace an expensive conventional through silicon via (TSV) by using the through hole H with the conductor 160. Since the through hole H on the carrier 110 does not require additional metallization process, fabrication costs of the chip stacking structure 100 may be reduced effectively.

Figure 3A:
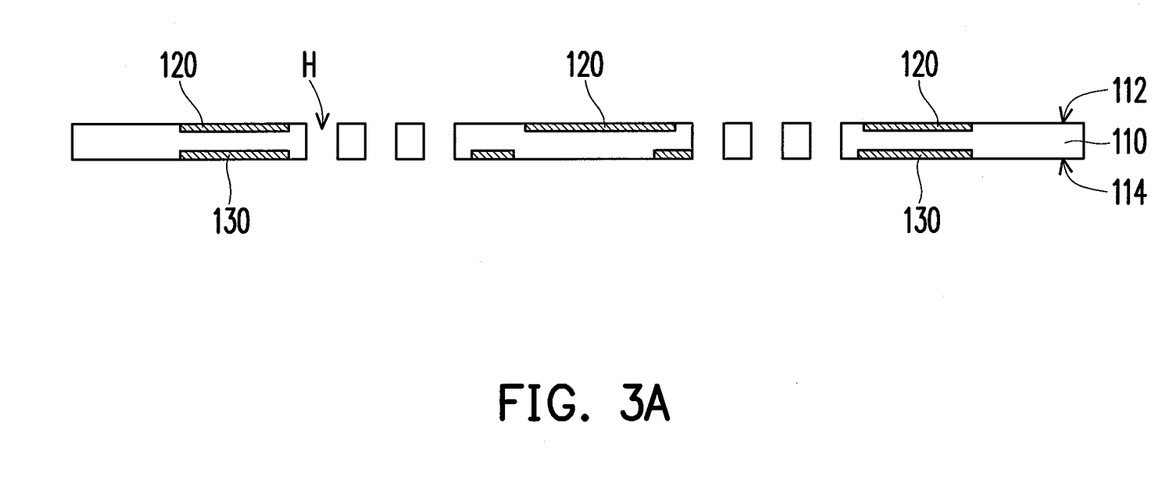
FIG. 3A and FIG. 3B are schematic views of a fabricating method of a chip stacking structure of the disclosure.
Figure 3B:
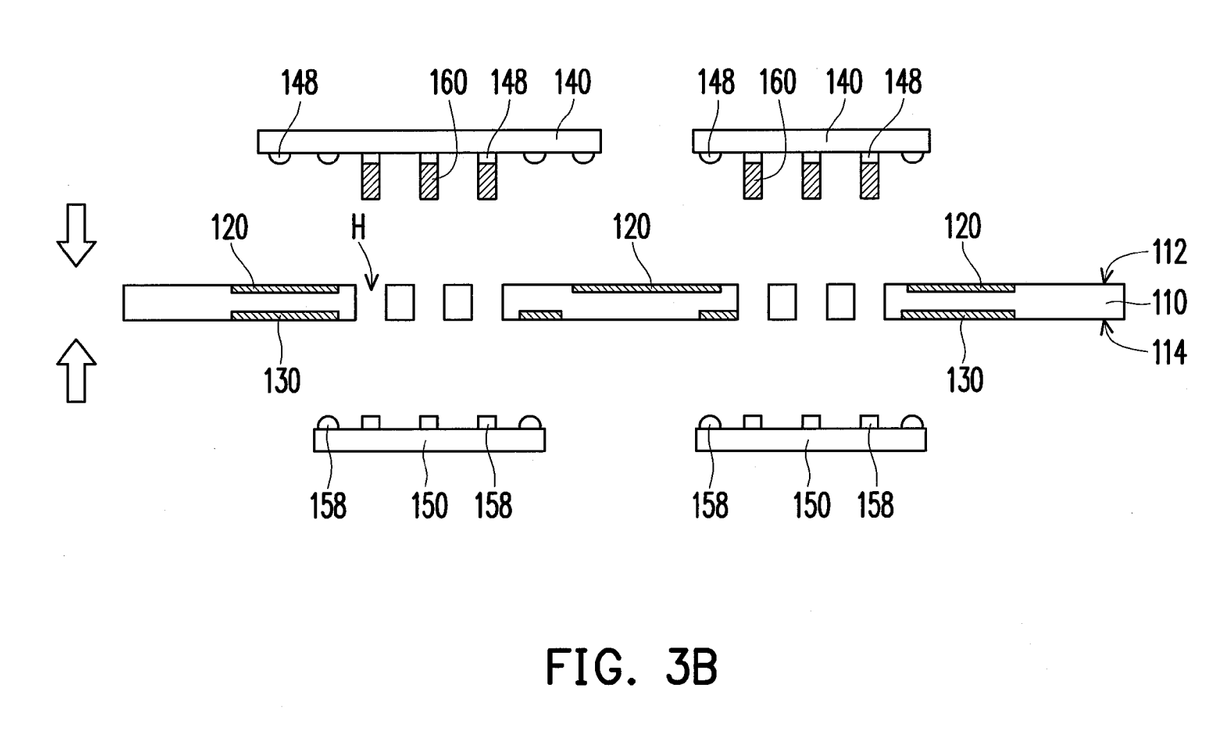

FIG. 3A and FIG. 3B are schematic views of a fabricating method of a chip stacking structure of the disclosure. Referring to FIG. 1 and FIG. 3A to FIG. 3B together, a fabricating method of the chip stacking structure may include following steps, and orders of steps may be properly modified by people having ordinary skill in the art. In addition, the same elements are indicated with the same numbers.

As shown in FIG. 2 and FIG. 3A, the carrier 110 is provided, having the first surface 112 and the second surface 114 opposite to each other. The carrier 110 has the at least one through hole H, and the first redistribution layer 120 is disposed on the first surface 112 of the carrier 110. The second redistribution layer 130 is disposed on the second surface 114 of the carrier 110.

As shown in FIG. 2 and FIG. 3B, the at least one first chip 140 is provided, which faces the first surface 112 of the carrier 110; and the at least one second chip 150 is provided, which faces the second surface 114 of the carrier 110, wherein the at least one conductor 160 is disposed on one of the first chip 140 and the second chip 150. In this embodiment, the first chip 140 has the conductor 160.

As shown with arrows in FIG. 3B, the conductor 160 passes through the through hole H and electrically connects the first chip 140 and the second chip 150, wherein the gap D is formed between the conductor 160 and the inner wall of the carrier 110 which surrounds the through hole H.

Positioning marks and a positioning apparatus may be utilized to ensure that the conductor 160 is aligned precisely to the through hole H, so that the carrier 110, the first chip 140, and the second chip 150 are assembled together to fabricate the chip stacking structure 100. Detailed implementation forms of each component of the chip stacking structure 100 are described as the aforementioned, and will not be repeated herein.

Referring to FIG. 2 and FIG. 3B, a method of forming the through hole H may be laser drilling method or ion etching method. When ion etching method is utilized, a deep reactive ion etch (DRIE) process may be utilized. The chip stacking structure 100 is to form the through hole H on the carrier 110, and does not require to electroplate a depositing conductive layer in the through hole H as a conventional TSV does.

FIG. 4A to FIG. 4G show schematic fabrication flowcharts of a carrier according to an embodiment of the disclosure. Referring to FIG. 4A to FIG. 4G a method of providing the carrier 110 includes following steps.

Figure 4A:
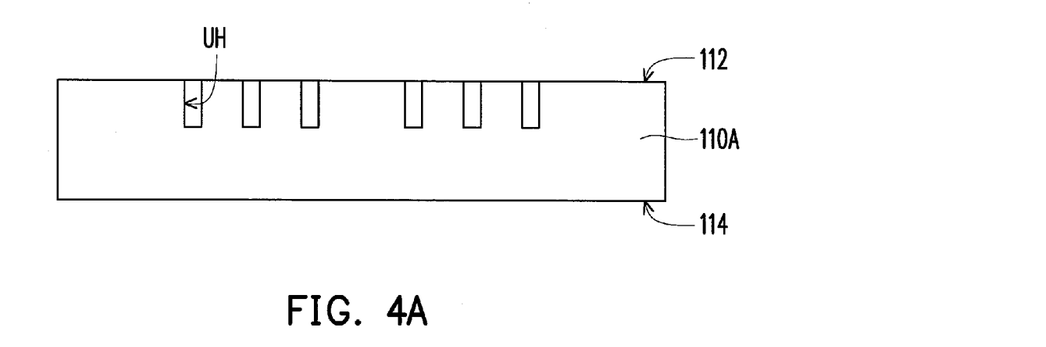
FIG. 4A to FIG. 4G show schematic fabrication flowcharts of a carrier according to an embodiment of the disclosure.

First, as shown in FIG. 4A, a carrier wafer 110A is provided, having a first surface 112 and a second surface 114 opposite to each other, and a non-through hole UH having a pre-determined depth is formed on the first surface 112 of the carrier wafer 110A. The laser drilling method or the deep reactive ion etch (DRIE) may be utilized to perform a fabrication of the non-through hole UH.

Figure 4B:
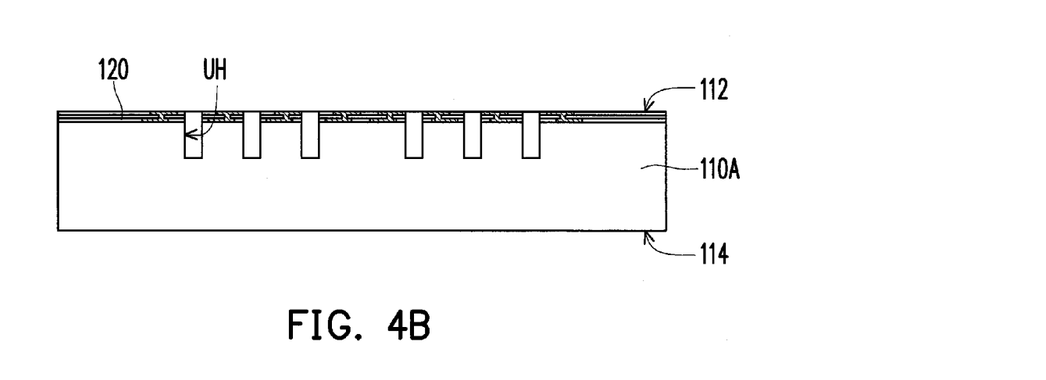

Then, as shown in FIG. 4B, the first redistribution layer 120 is formed on the first surface 112. A method of forming the first redistribution layer 120 may be utilizing a physical sputtering process to deposit metals, and then forming the first redistribution layer 120 having patterned circuits utilizing a lithography etching method. In addition, when the first redistribution layer 120 is formed on the first surface 112, the first microbump 148 may also be formed on the first surface 112. The first microbump 148 (as illustrated in FIG. 1 and FIG. 2A) is connected with the first redistribution layer 120.

Figure 4C:
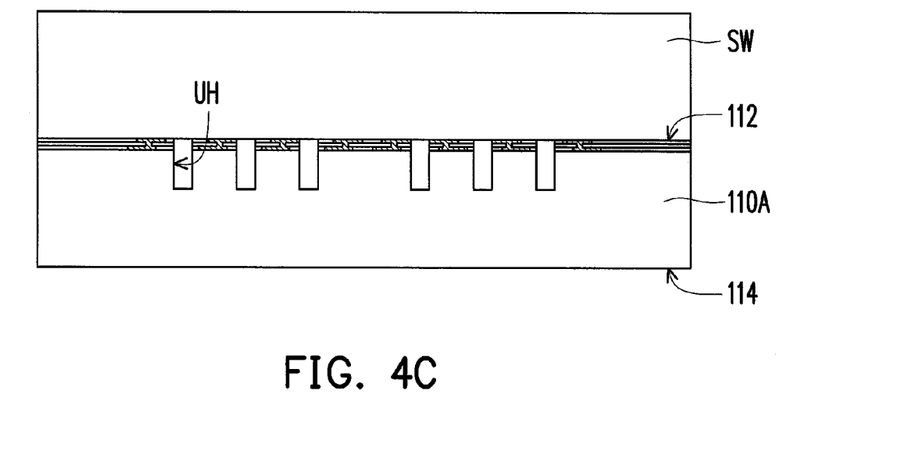

Next, as shown in FIG. 4C, a support wafer SW is provided, which bonds to the first surface 112 of the carrier wafer 110A and supports the carrier wafer 110A.

Figure 4D:
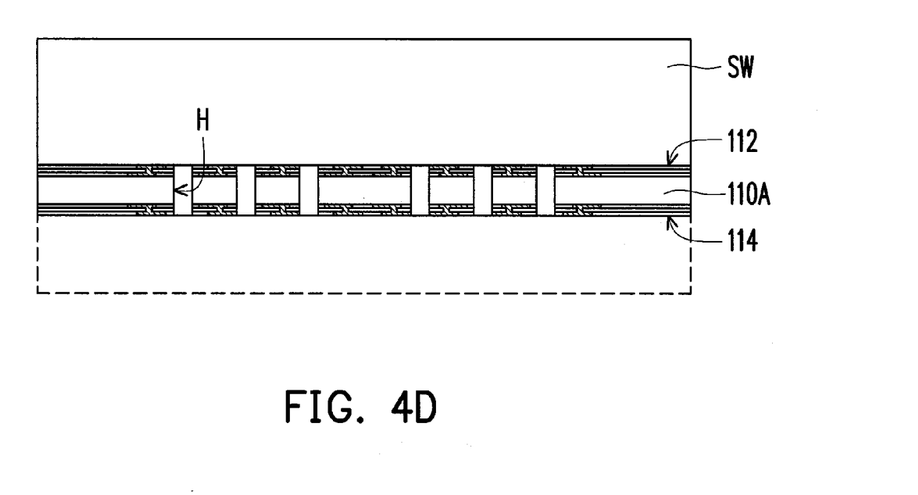

Then, as shown in FIG. 4D, a thickness of the carrier wafer 110A is removed partially (as marked with the dotted lines) from the second surface 114 of the carrier wafer 110A, so that the non-through hole UH is exposed from the second surface 114 to form the through hole H. The step may be performed utilizing a chemical mechanical polishing.

Next, as shown in FIG. 4D, the second redistribution layer 130 is formed on the second surface 114. A method of forming the second redistribution layer 130 may be utilizing a physical sputtering process to deposit metals, and then forming the second redistribution layer 130 having patterned circuits utilizing a lithography etching method. In addition, when the second redistribution layer 130 is formed on the second surface 114, the second microbump 158 may also be formed on the second surface 114 (as illustrated in FIG. 1 and FIG. 2B). The second microbump 158 is connected with the second redistribution layer 130.

Figure 4E:
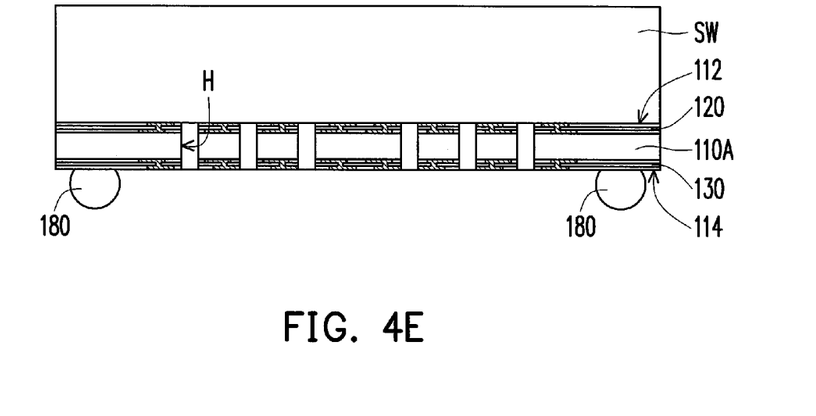

Then, as shown in FIG. 4E, a solder ball 180 is provided and connected with the second redistribution layer 130.

Figure 4F:
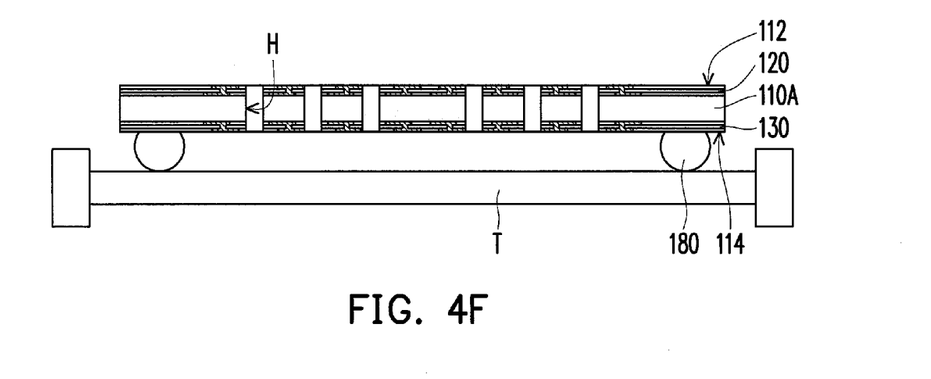

Next, as shown in FIG. 4F, the carrier wafer 110A is disposed on a dicing tape T via the solder ball 180, and the support wafer SW is removed.

Figure 4G:
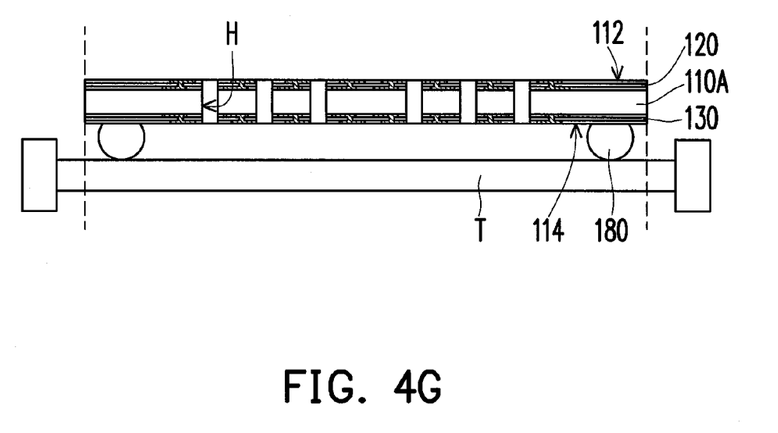

Later, as shown in FIG. 4G, the carrier wafer 110A is diced (as shown with the dotted lines for dicing in FIG. 4G) and forms the carrier 110 having the at least one through hole H.

The aforementioned is an example of a fabricating process of providing the carrier 110. Any proper modification to the design made by people having ordinary skill in the art by referring to the aforementioned descriptions of the disclosure is within the scope of the claims of the disclosure.

FIG. 5A to FIG. 5H show schematic fabrication flowcharts of a first chip or a second chip having a conductor. To understand related fabricating processes, please refer to FIG. 1, FIG. 2A to FIG. 2B, and FIG. 5A to FIG. 5I. The conductor 160 may be fabricated on the first chip 140, or the conductor 160 may be fabricated on the second chip 150, or the conductor 160 may be fabricated on both the first chip 140 and the second chip 150, as long as the carrier 110, the first chip 140, and the second chip 150 may be assembled.

A fabricating method related to one of the first chip 140 and the second chip 150 may includes following steps.

Figure 5A:
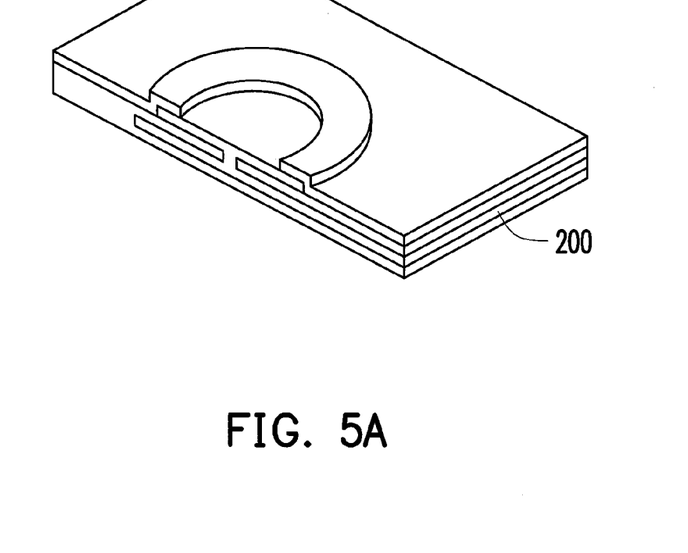
FIG. 5A to FIG. 5H show schematic fabrication flowcharts of a first chip having a conductor or a second chip having a conductor.

First, as shown in FIG. 5A, a wafer 200 is provided. The wafer 200 goes through a cleaning process to facilitate a subsequent lithography etching process and an electroplating process.

Figure 5B:
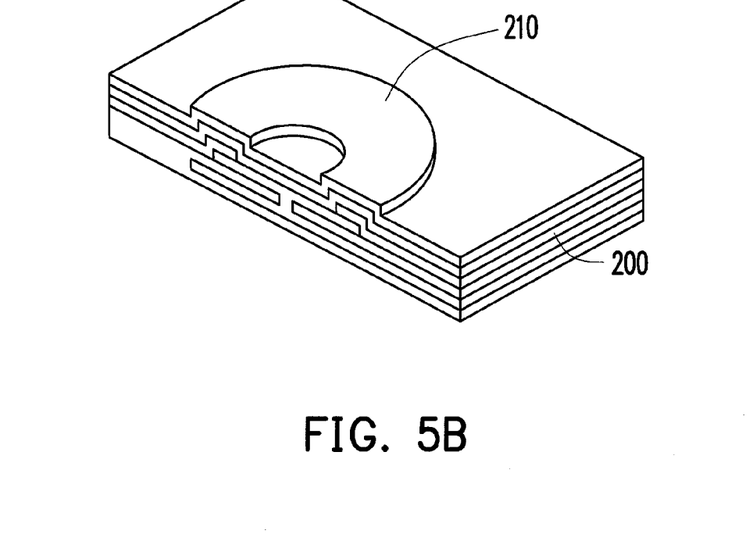

Next, as shown in FIG. 5B, an electroplating seed layer 210 is formed on the wafer 200, which may be formed by utilizing a physical sputtering method. A material of the electroplating seed layer 210 may be Cu.

Figure 5C:
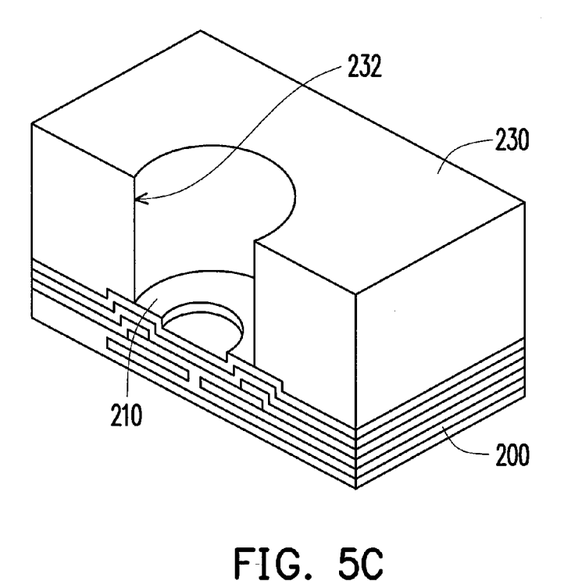

Then, as shown in FIG. 5C, a patterned photoresist layer 230 is formed and covers the electroplating seed layer 210, and the patterned photoresist layer 230 has an opening 232 that exposes the electroplating seed layer 210.

Figure 5D:
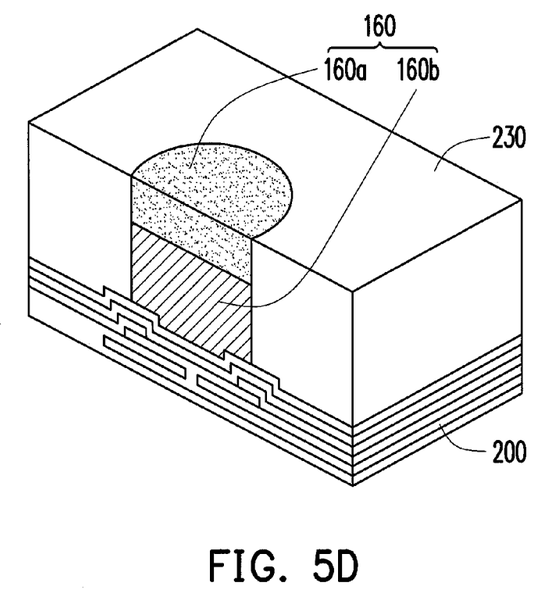

Then, as shown in FIG. 5D, the electroplating process is performed to form the conductor 160. The conductor 160 is connected with the exposed electroplating seed layer 210. The conductor 160 includes a solder joint layer 160a and a copper layer 160b.

Figure 5E:
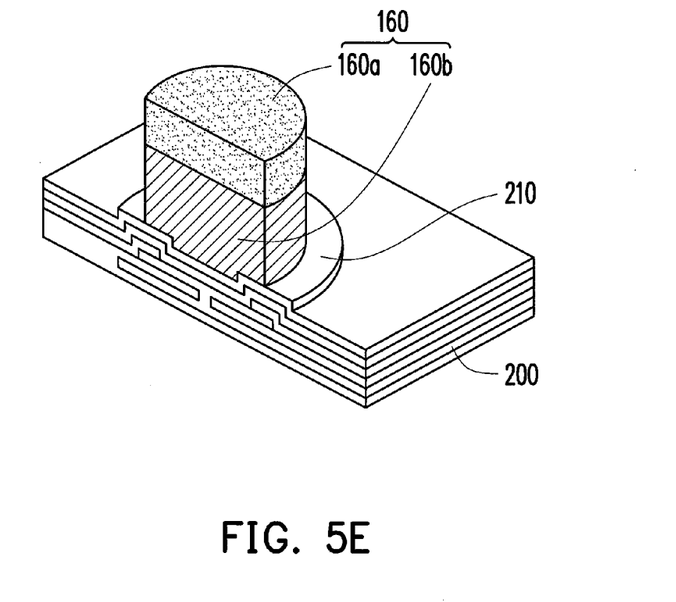
Figure 5F:
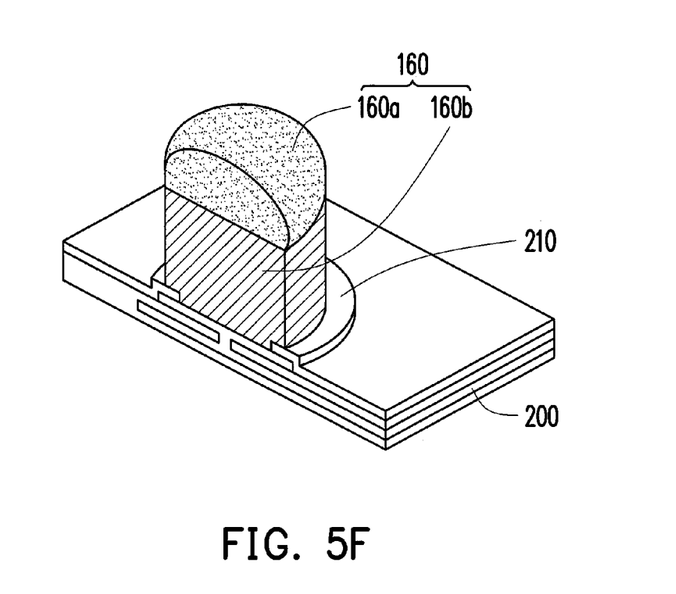

Next, as shown in FIG. 5E, the patterned photoresist layer 230 is removed. Also as shown in FIG. 5F, a reflow process may also be performed to the solder joint layer 160a and forms the solder joint layer 160a into a smooth shape.

Figure 5G:
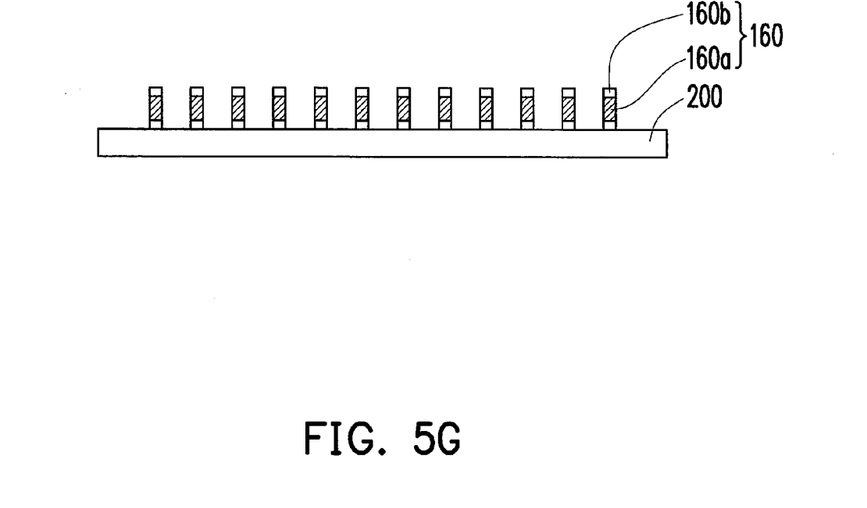
Figure 5H:
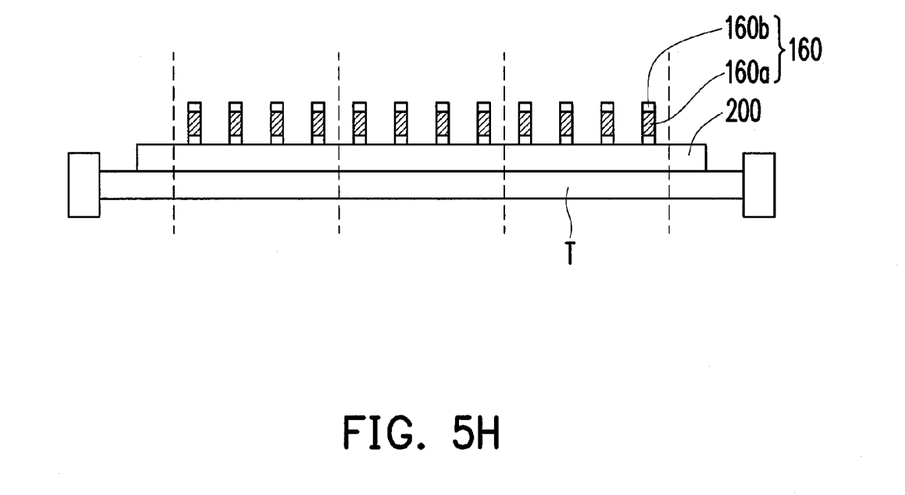

Then, as shown in FIG. 5G, a plurality of the conductors 160 formed on the wafer 200 are illustrated. A plurality of the first chips 140 or the second chips 150 are formed on the wafer 200. As shown in FIG. 5H, the wafer 200 is diced to form the first chips 140 having the conductors 160 or the second chips 150 having the conductors 160.

Later, the carrier 110, the first chips 140, and the second chips 150 may be assembled to form the chip stacking structure 100.

In conclusion, the chip stacking structure of the disclosure has a simple structure that may replace the expensive conventional TSV by using the through hole with the conductor. Since the through hole on the carrier does not require additional metallization process, fabrication costs of the chip stacking structure may be reduced effectively.

Although the disclosure has been disclosed by the above embodiments, they are not intended to limit the disclosure. It will be apparent to those of ordinary skill in the art that modifications and variations to the disclosure may be made without departing from the spirit and scope of the disclosure. In view of the foregoing, the protection scope of this disclosure falls within the appended claims.

What is claimed is:

1. A chip stacking structure, comprising:
   a carrier, having a first surface and a second surface opposite to each other, wherein the carrier has at least one through hole;
   a first redistribution layer, disposed on the first surface of the carrier;
   a second redistribution layer, disposed on the second surface of the carrier;
   at least one first chip, disposed on the first surface of the carrier and electrically connected with the first redistribution layer;
   at least one second chip, disposed on the second surface of the carrier and electrically connected with the second redistribution layer; and
   at least one conductor, disposed on one of the first chip and the second chip, wherein the conductor is disposed in the through hole, and the first chip and the second chip are electrically connected by the conductor,
   wherein a gap is formed between the conductor and an inner wall of the carrier which surrounds the through hole.

2. The chip stacking structure as recited in claim 1, wherein the first chip comprises:
   a first substrate;
   a first circuit layer, disposed on the first substrate;
   a first patterned insulating layer, covering the first circuit layer, and the first patterned insulating layer exposing a part of the first circuit layer; and
   a first microbump, disposed on the exposed first circuit layer,
   wherein the conductor is connected with the first microbump.

3. The chip stacking structure as recited in claim 2, wherein the first microbump comprises a plurality of film layers being stacked.

4. The chip stacking structure as recited in claim 3, wherein the plurality of film layers are a TiW film layer, a Cu film layer, and a Ni film layer.

5. The chip stacking structure as recited in claim 1, wherein the second chip comprises:
   a second substrate;
   a second circuit layer, disposed on the second substrate;
   a second patterned insulating layer, covering the second circuit layer, and the second patterned insulating layer exposing a part of the second circuit layer; and
   a second microbump, disposed on the exposed second circuit layer.

6. The chip stacking structure as recited in claim 5, wherein the second microbump comprises a plurality of film layers being stacked.

7. The chip stacking structure as recited in claim 6, wherein the plurality of film layers are a TiW film layer, a Cu film layer, and a Ni film layer.

8. The chip stacking structure as recited in claim 1, wherein the conductor comprises a conductive wire, a conductive pillar, or a conductive pad.

9. The chip stacking structure as recited in claim 1, wherein materials of the conductor are selected from Au, Cu, Ni, Ag, and a combination thereof.

10. The chip stacking structure as recited in claim 1, wherein the first chip comprises:
    at least one first microbump, connected between the first chip and the first redistribution layer.

11. The chip stacking structure as recited in claim 1, wherein the second chip comprises:
    at least one second microbump, connected between the second chip and the second redistribution layer.

12. The chip stacking structure as recited in claim 1, further comprising:
    a carrier board, having a third redistribution layer; and
    a solder ball, disposed between the second redistribution layer and the third redistribution layer.

13. The chip stacking structure as recited in claim 1, wherein the gap is filled with air or inert gas.

14. The chip stacking structure as recited in claim 1, wherein the gap is filled with an insulating filler.

15. A fabricating method of a chip stacking structure, comprising:
    providing a carrier having a first surface and a second surface opposite to each other, wherein the carrier has at least one through hole, and a first redistribution layer is disposed on the first surface of the carrier, and a second redistribution layer is disposed on the second surface of the carrier;
    providing at least one first chip facing the first surface of the carrier;
    providing at least one second chip facing the second surface of the carrier, wherein at least one conductor is disposed on one of the first chip and the second chip; and
    making the conductor pass through the through hole and electrically connect the first chip with the second chip, wherein a gap is formed between the conductor and an inner wall of the carrier which surrounds the through hole.

16. The fabricating method of the chip stacking structure as recited in claim 15, wherein the first chip comprises:
    a first substrate;
    a first circuit layer, disposed on the first substrate;
    a first patterned insulating layer, covering the first circuit layer, and the first patterned insulating layer exposing a part of the first circuit layer; and
    a first microbump, disposed on the exposed first circuit layer,
    wherein the conductor is connected with the first microbump.

17. The fabricating method of the chip stacking structure as recited in claim 16, wherein the first microbump comprises a plurality of film layers being stacked.

18. The fabricating method of the chip stacking structure as recited in claim 15, wherein the second chip comprises:
    a second substrate;
    a second circuit layer, disposed on the second substrate;
    a second patterned insulating layer, covering the second circuit layer, and the second patterned insulating layer exposing a part of the second circuit layer; and
    a second microbump, disposed on the exposed second circuit layer.

19. The fabricating method of the chip stacking structure as recited in claim 18, wherein the second microbump comprises a plurality of film layers being stacked.

20. The fabricating method of the chip stacking structure as recited in claim 15, wherein the conductor comprises a conductive wire, a conductive pillar, or a conductive pad.

21. The fabricating method of the chip stacking structure as recited in claim 15, wherein materials of the conductor are selected from Au, Cu, Ni, Ag, and a combination thereof.

22. The fabricating method of the chip stacking structure as recited in claim 15, wherein the first chip comprises:
   at least one first microbump, connected between the first chip and the first redistribution layer.

23. The fabricating method of the chip stacking structure as recited in claim 15, wherein the second chip comprises:
   at least one second microbump, connected between the second chip and the second redistribution layer.

24. The fabricating method of the chip stacking structure as recited in claim 15, further comprising:
   providing a carrier board having a third redistribution layer; and
   providing a solder ball disposed between the second redistribution layer and the third redistribution layer.

25. The fabricating method of the chip stacking structure as recited in claim 15, wherein the gap is filled with air or inert gas.

26. The fabricating method of the chip stacking structure as recited in claim 15, wherein the gap is filled with an insulating filler.

27. The fabricating method of the chip stacking structure as recited in claim 15, wherein a method of forming the through hole comprises laser drilling method or ion etching method.

28. The fabricating method of the chip stacking structure as recited in claim 15, wherein a method of providing the carrier comprises:
   providing a carrier wafer having a first surface and a second surface opposite to each other, a non-through hole having a pre-determined depth being formed on the first surface of the carrier wafer;
   forming the first redistribution layer on the first surface;
   providing a support wafer bonding to the first surface of the carrier wafer and supporting the carrier wafer;
   forming the through hole by partially removing a thickness of the carrier wafer from the second surface of the carrier wafer and exposing the non-through hole from the second surface;
   forming the second redistribution layer on the second surface;
   providing a solder ball connected to the second redistribution layer;
   disposing the carrier wafer on a dicing tape via the solder ball and removing the support wafer; and
   dicing the carrier wafer to form the carrier having at least the through hole.

29. The fabricating method of the chip stacking structure as recited in claim 28, when the first redistribution layer is formed on the first surface, further comprising:
   forming a first microbump on the first surface,
   wherein the first microbump is connected with the first redistribution layer.

30. The fabricating method of the chip stacking structure as recited in claim 28, when the second redistribution layer is formed on the second surface, further comprising:
   forming a second microbump on the second surface,
   wherein the second microbump is connected with the second redistribution layer.

31. The fabricating method of the chip stacking structure as recited in claim 15, wherein a fabricating method of one of the first chip and the second chip comprises:
   providing a wafer;
   forming an electroplating seed layer on the wafer;
   forming a patterned photoresist layer covering the electroplating seed layer, and the patterned photoresist layer having an opening exposing the electroplating seed layer;
   performing an electroplating process to form the conductor, wherein the conductor is connected with the exposed electroplating seed layer;
   removing the patterned photoresist layer; and
   dicing the wafer to form the first chip having the conductor or the second chip having the conductor.

\* \* \* \* \*